United States Patent
Gong (10) Patent No.: US 10,049,639 B2
(45) Date of Patent: Aug. 14, 2018

(54) CMOS GATE DRIVE ON ARRAY (GOA) CIRCUIT STRUCTURE AND LIQUID CRYSTAL DISPLAY PANEL

(71) Applicant: WUHAN CHINA STAR OPTOELECTRONICS TECHNOLOGY CO., LTD., Wuhan, Hubei (CN)

(72) Inventor: Qiang Gong, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 191 days.

(21) Appl. No.: 15/124,625

(22) PCT Filed: Jun. 14, 2016

(86) PCT No.: PCT/CN2016/085647
§ 371 (c)(1),
(2) Date: Sep. 8, 2016

(87) PCT Pub. No.: WO2017/197687
PCT Pub. Date: Nov. 23, 2017

(65) Prior Publication Data
US 2018/0166039 A1    Jun. 14, 2018

(30) Foreign Application Priority Data
May 20, 2016  (CN) .......................... 2016 1 0339066

(51) Int. Cl.
*G09G 3/36*  (2006.01)

(52) U.S. Cl.
CPC ......... *G09G 3/3696* (2013.01); *G09G 3/3677* (2013.01); *G09G 2300/0426* (2013.01); *G09G 2300/0823* (2013.01); *G09G 2310/0291* (2013.01); *G09G 2310/06* (2013.01)

(58) Field of Classification Search
None
See application file for complete search history.

(56) References Cited

U.S. PATENT DOCUMENTS

| | | | |
|---|---|---|---|
| 2016/0188074 A1* | 6/2016 | Xiao | G06F 3/0416 345/173 |
| 2017/0092172 A1* | 3/2017 | Wang | G09G 3/20 |
| 2017/0148401 A1* | 5/2017 | Zhao | G09G 3/3648 |
| 2017/0193944 A1* | 7/2017 | Xiao | G09G 3/3677 |
| 2018/0032183 A1* | 2/2018 | Gong | G06F 3/0412 |
| 2018/0068630 A1* | 3/2018 | Xiao | G09G 3/3677 |

\* cited by examiner

*Primary Examiner* — Chad Dicke
(74) *Attorney, Agent, or Firm* — Muncy, Geissler, Olds & Lowe, P.C.

(57) ABSTRACT

A Complementary Metal-Oxide-Semiconductor (CMOS) Gate Driver on Array (GOA) circuit includes a plurality of cascaded GOA units, where each of the GOA units comprises a forward-rearward control module, a signal-latch module, a signal-process module, and a signal-buffer module. A waveform of a scan-line driving signal outputted has two falling edges, to prevent un-uniformity of a liquid crystal panel display by decreasing high-shift voltage value of the pixel electrodes caused by the voltage coupling while charging pixel electrodes.

19 Claims, 2 Drawing Sheets

CMOS GATE DRIVE ON ARRAY (GOA) CIRCUIT STRUCTURE AND LIQUID CRYSTAL DISPLAY PANEL

BACKGROUND OF THE INVENTION

Field of Invention

The present invention relates to the field of driving circuit technology, and more particularly to a Complementary Metal-Oxide-Semiconductor (CMOS) Gate Driver on Array (GOA) circuit structure and a liquid crystal display panel.

Description of Prior Art

GOA is an array substrate driving technology that uses thin film transistors (TFTs) liquid crystal display array manufacturing process to manufacture a gate scan-driving circuit on a TFT array substrate, to accomplish a driving method of line by line scanning. Advantages are lower manufacturing cost, narrow bezel panel designs, and can be used in numerous displays. A GOA circuit has two basic functions: first, outputting a scan-driving signal to drive gate-electrode lines inside a driving panel, to turn on TFTs inside the display region, and then charging the pixels; second, acting as a shift register, where after an output of a Nth scan-driving signal is finished, a clock is used to control an output of a N+1th scan-driving signal, to accomplish cascade scanning. In Low Temperature Poly-Silicon (LTPS) semiconductor TFTs, LTPS TFT liquid crystal displays are becoming more popular, because silicon crystal arrangement of LTPS is more orderly than silicon crystal arrangement of amorphous silicon. Thus, LTPS semiconductors have extremely high carrier mobilities, hence, liquid crystal displays using LTPS TFTs have high resolutions, quick response times, high luminance, and high aperture ratios. Accordingly, integrated circuits for the LTPS TFT liquid crystal display panels are becoming a focus of display technology.

Conventionally, after charging pixel electrodes, voltage coupling occurs at the moment of turning off gate-electrode lines, thus causing a difference between the voltage charged into the pixel electrodes and the voltage of the data lines. Although, it is possible to adjust the common electrode voltage to compensate for the difference, because of manufacturing process deviations, there is a larger voltage coupling, thus the unbalance of the common electrode voltage caused by the manufacturing deviation will be more apparent. So, it is meaningful to increase panel uniformity by lowering the voltage coupling while charging the pixel electrodes. Thus, to lower the voltage coupling while charging the pixel electrodes, a waveform of scan-line driving signal with two falling edges is outputted on some gate-electrode driving circuits; however, it is not suitable for GOA panels.

SUMMARY OF THE INVENTION

An objective of the present invention is to provide a Complementary Metal-Oxide-Semiconductor (CMOS) Gate Driver on Array (GOA) circuit and a liquid crystal display panel, to solve the issue of the conventional art, the issue is: after charging the pixel electrodes of the liquid crystal panel, voltage coupling occurs while turning on and off the scanning lines, which causes inconsistent voltage between the voltage charged into the pixel electrodes and the voltage of the data lines, and causing un-uniformity of liquid crystal panel display.

The technical proposal of the present invention is as below:

A CMOS GOA circuit, which comprises a plurality of cascaded GOA units, each of the GOA units comprises:

A forward-rearward control module, signals inputted to an input terminal of the forward-rearward control module comprise a first scan-control signal, a second scan-control signal, a first level-transfer signal, and a second level-transfer signal. The forward-rearward control module is used to control an output of the first level-transfer signal and the second level-transfer signal according to the first scan-control signal and the second scan-control signal.

A signal-latch module, signals inputted to an input terminal of the signal-latch module comprise a first clock signal and the first level-transfer signal or the second level-transfer signal. The signal-latch module is used to latch the first level-transfer signal or the second level-transfer signal according to the first clock signal, to generate a third level-transfer signal.

A signal-process module, signals inputted to an input terminal of the signal-process module comprise a second clock signal and the third level-transfer signal. The signal-process module is used to output a current level gate-electrode driving signal according to the second clock signal and the third level-transfer signal.

A signal-buffer module, signals inputted to an input terminal of the signal-buffer module comprise the gate-electrode driving signal, a first high voltage signal, a first low voltage signal, a second high voltage signal, and a third clock signal. An amplitude of the second high voltage signal being less than amplitude of the first high voltage signal. The signal-buffer module is used to output a scan-line driving signal according to the first high voltage signal, the first low voltage signal, the second high voltage signal, the third clock signal, and the gate-electrode driving signal. An output waveform of the scan-line driving signal has a first high electric potential corresponding with the first high voltage signal, a second high electric potential corresponding with the second high voltage signal, and a first low electric potential corresponding with the first low voltage signal. The waveform is formed by the first high electric potential, the second high electric potential. The first low electric potential having two falling edges.

Wherein the signal-buffer module comprises:

A first inverter, which comprises a sixth NPN-type thin film transistor and a seventh PNP-type thin film transistor, the first inverter is used to input the gate-electrode driving signal, the first high voltage signal, and the first low voltage signal.

A second inverter, which comprises a eighth NPN-type thin film transistor and a ninth PNP-type thin film transistor, the second inverter is used to be inputted the first high voltage signal, and the first low voltage signal.

A thin film transistor group, which comprises a first NPN-type thin film transistor, a second PNP-type thin film transistor, a third PNP-type thin film transistor, a fourth PNP-type thin film transistor, and a fifth NPN-type thin film transistor. The thin film transistor group is used to be inputted the first high voltage signal, the first low voltage signal, the second high voltage signal, and the third clock signal. The thin film transistor group is used to output the scan-line driving signal to a current-level scanning line.

A gate electrode of the sixth thin film transistor connects with a gate electrode of the seventh thin film transistor to form a first connecting line, a drain electrode of the sixth thin film transistor connects with a source electrode of the seventh thin film transistor to form a second connecting line, a gate electrode of the eighth thin film transistor connects with a gate electrode of the ninth thin film transistor to form a third connecting line, a drain electrode of the eighth thin film transistor connects with a source electrode of the ninth thin film transistor to form a fourth connecting line, a gate electrode of the first thin film transistor connects with a gate electrode of the second thin film transistor to form a fifth connecting line, a drain electrode of the first thin film transistor connects with a source electrode of the third thin film transistor to form a sixth connecting line, a drain electrode of the second thin film transistor connects with a drain electrode of the fourth thin film transistor to form a seventh connecting line, a drain electrode of the third thin film transistor connects with a source electrode of the fifth thin film transistor to form an eighth connecting line, a gate electrode of the fourth thin film transistor connects with a gate electrode of the fifth thin film transistor to form a ninth connecting line, the second thin film transistor and the third thin film transistor connect with each other and have equal voltage.

The gate-electrode driving signal is input to the first connecting line, the second connecting line connects with the third connecting line, the fourth connecting line connects with the fifth connecting line, an input terminal of the first high voltage signal is connected with a drain electrode of the seventh thin film transistor, a drain electrode of the ninth thin film transistor, and a source electrode of the fourth thin film transistor, an input terminal of the first low voltage signal connects with a source electrode of the sixth thin film transistor, a source electrode of the eighth thin film transistor, and a source electrode of the first thin film transistor, an input terminal of the third clock signal connects with the ninth connecting line, an output terminal of the scan-line driving signal is the drain electrode of the first thin film transistor, a source electrode of the second thin film transistor, and the source electrode of the third thin film transistor.

The forward-rearward control module comprises:

A tenth thin film transistor, a gate electrode of the tenth thin film transistor is an input terminal of the first scan-control signal, a drain electrode and a gate electrode of the tenth thin film transistor are respectively an input terminal and an output terminal of the first level-transfer signal. The tenth thin film transistor is used to control an output of the first level-transfer signal according to the first scan-control signal.

An eleventh thin film transistor, a gate electrode of the eleventh thin film transistor is an input terminal of the second scan-control signal, a drain electrode and a gate electrode of the eleventh thin film transistor are respectively an input terminal and an output terminal of the first level-transfer signal. The eleventh thin film transistor is used to control an output of the first level-transfer signal according to the second scan-control signal.

A twelfth thin film transistor, a gate electrode of the twelfth thin film transistor is an input terminal of the first scan-control signal, a drain electrode and a gate electrode of the twelfth thin film transistor are respectively an input terminal and an output terminal of the second level-transfer signal. The twelfth thin film transistor is used to control an output of the second level-transfer signal according to the first scan-control signal.

A thirteenth thin film transistor, a gate electrode of the thirteenth thin film transistor is an input terminal of the second scan-control signal, a drain electrode and a gate electrode of the thirteenth thin film transistor are respectively an input terminal and an output terminal of the second level-transfer signal. The thirteenth thin film transistor is used to control an output of the second level-transfer signal according to the second scan-control signal.

Preferably, the signal-latch module further comprises a reset switch. The reset switch is a fourteenth thin film transistor, a gate electrode of the fourteenth thin film transistor is input to a reset signal, a source electrode of the fourteenth thin film transistor connects with a high voltage source, a drain electrode of the fourteenth thin film transistor connects with the signal-latch module.

Preferably, while the gate-electrode driving signal inputted to the signal-buffer module is a high voltage signal, the first thin film transistor is on, the second thin film transistor and the third thin film transistor are off, the signal-buffer module outputs the first low voltage signal corresponding the first low electric potential, as the scan-line driving signal.

Preferably, while the gate-electrode driving signal inputted to the signal-buffer module is a low voltage signal, the first thin film transistor is off, the second thin film transistor and the third thin film transistor are on, if the third clock signal inputted is a low voltage signal, the fourth thin film transistor is on, the fifth thin film transistor is off, the signal-buffer module outputs the first high voltage signal corresponding the first high electric potential, as the scan-line driving signal.

Preferably, while the gate-electrode driving signal inputted to the signal-buffer module is a low voltage signal, the first thin film transistor is off, the second thin film transistor and the third thin film transistor are on, if the third clock signal inputted is a high voltage signal, the fourth thin film transistor is off, the fifth thin film transistor is on, the signal-buffer module outputs the second high voltage signal corresponding the second high electric potential, as the scan-line driving signal.

A CMOS GOA circuit, which comprises a plurality of cascaded GOA units, each of the GOA units:

A forward-rearward control module, signals inputted to an input terminal of the forward-rearward control module comprise a first scan-control signal, a second scan-control signal, a first level-transfer signal, and a second level-transfer signal. The forward-rearward control module is used to control an output of the first level-transfer signal and the second level-transfer signal according to the first scan-control signal and the second scan-control signal.

A signal-latch module, signals inputted to an input terminal of the signal-latch module comprise a first clock signal and the first level-transfer signal or the second level-transfer signal. The signal-latch module is used to latch the first level-transfer signal or the second level-transfer signal according to the first clock signal, to generate a third level-transfer signal.

A signal-process module, signals inputted to an input terminal of the signal-process module comprise a second clock signal and the third level-transfer signal. The signal-process module is used to output a current level gate-electrode driving signal according to the second clock signal and the third level-transfer signal.

A signal-buffer module, signals inputted to an input terminal of the signal-buffer module comprise the gate-electrode driving signal, a first high voltage signal, a first low voltage signal, a second high voltage signal, and a third clock signal. An amplitude of the second high voltage signal being less than amplitude of the first high voltage signal. The signal-buffer module is used to output a scan-line driving signal according to the first high voltage signal, the first low voltage signal, the second high voltage signal, the third clock signal, and the gate-electrode driving signal. An output waveform of the scan-line driving signal has a first high electric potential corresponding with the first high voltage signal, a second high electric potential corresponding with the second high voltage signal, and a first low electric potential corresponding with the first low voltage signal. The waveform is formed by the first high electric potential, the second high electric potential. The first low electric potential having two falling edges.

Preferably, the signal-buffer module comprises:

A first inverter, which comprises a sixth NPN-type thin film transistor and a seventh PNP-type thin film transistor, the first inverter is used to input the gate-electrode driving signal, the first high voltage signal, and the first low voltage signal.

A second inverter, which comprises a eighth NPN-type thin film transistor and a ninth PNP-type thin film transistor, the second inverter is used to be inputted the first high voltage signal, and the first low voltage signal.

A thin film transistor group, which comprises a first NPN-type thin film transistor, a second PNP-type thin film transistor, a third PNP-type thin film transistor, a fourth PNP-type thin film transistor, and a fifth NPN-type thin film transistor. The thin film transistor group is used to be inputted the first high voltage signal, the first low voltage signal, the second high voltage signal, and the third clock signal. The thin film transistor group is used to output the scan-line driving signal to a current-level scanning line.

A gate electrode of the sixth thin film transistor connects with a gate electrode of the seventh thin film transistor to form a first connecting line, a drain electrode of the sixth thin film transistor connects with a source electrode of the seventh thin film transistor to form a second connecting line, a gate electrode of the eighth thin film transistor connects with a gate electrode of the ninth thin film transistor to form a third connecting line, a drain electrode of the eighth thin film transistor connects with a source electrode of the ninth thin film transistor to form a fourth connecting line, a gate electrode of the first thin film transistor connects with a gate electrode of the second thin film transistor to form a fifth connecting line, a drain electrode of the first thin film transistor connects with a source electrode of the third thin film transistor to form a sixth connecting line, a drain electrode of the second thin film transistor connects with a drain electrode of the fourth thin film transistor to form a seventh connecting line, a drain electrode of the third thin film transistor connects with a source electrode of the fifth thin film transistor to form an eighth connecting line, a gate electrode of the fourth thin film transistor connects with a gate electrode of the fifth thin film transistor to form a ninth connecting line, the second thin film transistor and the third thin film transistor connect with each other and have equal voltage.

The gate-electrode driving signal is input to the first connecting line, the second connecting line connects with the third connecting line, the fourth connecting line connects with the fifth connecting line, an input terminal of the first high voltage signal is connected with a drain electrode of the seventh thin film transistor, a drain electrode of the ninth thin film transistor, and a source electrode of the fourth thin film transistor, an input terminal of the first low voltage signal connects with a source electrode of the sixth thin film transistor, a source electrode of the eighth thin film transistor, and a source electrode of the first thin film transistor, an input terminal of the third clock signal connects with the ninth connecting line, an output terminal of the scan-line driving signal is the drain electrode of the first thin film transistor, a source electrode of the second thin film transistor, and the source electrode of the third thin film transistor.

Preferably, the forward-rearward control module comprises:

A tenth thin film transistor, a gate electrode of the tenth thin film transistor is an input terminal of the first scan-control signal, a drain electrode and a gate electrode of the tenth thin film transistor are respectively an input terminal and an output terminal of the first level-transfer signal. The tenth thin film transistor is used to control an output of the first level-transfer signal according to the first scan-control signal.

An eleventh thin film transistor, a gate electrode of the eleventh thin film transistor is an input terminal of the second scan-control signal, a drain electrode and a gate electrode of the eleventh thin film transistor are respectively an input terminal and an output terminal of the first level-transfer signal. The eleventh thin film transistor is used to control an output of the first level-transfer signal according to the second scan-control signal.

A twelfth thin film transistor, a gate electrode of the twelfth thin film transistor is an input terminal of the first scan-control signal, a drain electrode and a gate electrode of the twelfth thin film transistor are respectively an input terminal and an output terminal of the second level-transfer signal. The twelfth thin film transistor is used to control an output of the second level-transfer signal according to the first scan-control signal.

A thirteenth thin film transistor, a gate electrode of the thirteenth thin film transistor is an input terminal of the second scan-control signal, a drain electrode and a gate electrode of the thirteenth thin film transistor are respectively an input terminal and an output terminal of the second level-transfer signal. The thirteenth thin film transistor is used to control an output of the second level-transfer signal according to the second scan-control signal.

Preferably, the signal-latch module further comprises a reset switch. The reset switch is a fourteenth thin film transistor, a gate electrode of the fourteenth thin film transistor is input to a reset signal, a source electrode of the fourteenth thin film transistor connects with a high voltage source, a drain electrode of the fourteenth thin film transistor connects with the signal-latch module.

Preferably, while the gate-electrode driving signal inputted to the signal-buffer module is a high voltage signal, the first thin film transistor is on, the second thin film transistor and the third thin film transistor are off, the signal-buffer module outputs the first low voltage signal corresponding the first low electric potential, as the scan-line driving signal.

Preferably, while the gate-electrode driving signal inputted to the signal-buffer module is a low voltage signal, the first thin film transistor is off, the second thin film transistor and the third thin film transistor are on, if the third clock signal inputted is a low voltage signal, the fourth thin film transistor is on, the fifth thin film transistor is off, the signal-buffer module outputs the first high voltage signal corresponding the first high electric potential, as the scan-line driving signal.

Preferably, while the gate-electrode driving signal inputted to the signal-buffer module is a low voltage signal, the first thin film transistor is off, the second thin film transistor and the third thin film transistor are on, if the third clock signal inputted is a high voltage signal, the fourth thin film transistor is off, the fifth thin film transistor is on, the signal-buffer module outputs the second high voltage signal corresponding the second high electric potential, as the scan-line driving signal.

A liquid crystal display panel, which comprises a CMOS GOA circuit, the CMOS GOA circuit comprises a plurality of cascaded GOA units, each of the GOA units comprises:

A forward-rearward control module, signals inputted to an input terminal of the forward-rearward control module comprise a first scan-control signal, a second scan-control signal, a first level-transfer signal, and a second level-transfer signal. The forward-rearward control module is used to control an output of the first level-transfer signal and the second level-transfer signal according to the first scan-control signal and the second scan-control signal.

A signal-latch module, signals inputted to an input terminal of the signal-latch module comprise a first clock signal and the first level-transfer signal or the second level-transfer signal. The signal-latch module is used to latch the first level-transfer signal or the second level-transfer signal according to the first clock signal, to generate a third level-transfer signal.

A signal-process module, signals inputted to an input terminal of the signal-process module comprise a second clock signal and the third level-transfer signal. The signal-process module is used to output a current level gate-electrode driving signal according to the second clock signal and the third level-transfer signal.

A signal-buffer module, signals inputted to an input terminal of the signal-buffer module comprise the gate-electrode driving signal, a first high voltage signal, a first low voltage signal, a second high voltage signal, and a third clock signal. An amplitude of the second high voltage signal being less than amplitude of the first high voltage signal. The signal-buffer module is used to output a scan-line driving signal according to the first high voltage signal, the first low voltage signal, the second high voltage signal, the third clock signal, and the gate-electrode driving signal. An output waveform of the scan-line driving signal has a first high electric potential corresponding with the first high voltage signal, a second high electric potential corresponding with the second high voltage signal, and a first low electric potential corresponding with the first low voltage signal. The waveform is formed by the first high electric potential, the second high electric potential. The first low electric potential having two falling edges.

Preferably, the signal-buffer module comprises:

A first inverter, which comprises a sixth NPN-type thin film transistor and a seventh PNP-type thin film transistor, the first inverter is used to input the gate-electrode driving signal, the first high voltage signal, and the first low voltage signal.

A second inverter, which comprises an eighth NPN-type thin film transistor and a ninth PNP-type thin film transistor, the second inverter is used to be inputted the first high voltage signal, and the first low voltage signal.

A thin film transistor group, which comprises a first NPN-type thin film transistor, a second PNP-type thin film transistor, a third PNP-type thin film transistor, a fourth PNP-type thin film transistor, and a fifth NPN-type thin film transistor. The thin film transistor group is used to be inputted the first high voltage signal, the first low voltage signal, the second high voltage signal, and the third clock signal. The thin film transistor group is used to output the scan-line driving signal to a current-level scanning line.

A gate electrode of the sixth thin film transistor connects with a gate electrode of the seventh thin film transistor to form a first connecting line, a drain electrode of the sixth thin film transistor connects with a source electrode of the seventh thin film transistor to form a second connecting line, a gate electrode of the eighth thin film transistor connects with a gate electrode of the ninth thin film transistor to form a third connecting line, a drain electrode of the eighth thin film transistor connects with a source electrode of the ninth thin film transistor to form a fourth connecting line, a gate electrode of the first thin film transistor connects with a gate electrode of the second thin film transistor to form a fifth connecting line, a drain electrode of the first thin film transistor connects with a source electrode of the third thin film transistor to form a sixth connecting line, a drain electrode of the second thin film transistor connects with a drain electrode of the fourth thin film transistor to form a seventh connecting line, a drain electrode of the third thin film transistor connects with a source electrode of the fifth thin film transistor to form an eighth connecting line, a gate electrode of the fourth thin film transistor connects with a gate electrode of the fifth thin film transistor to form a ninth connecting line, the second thin film transistor and the third thin film transistor connect with each other and have equal voltage.

The gate-electrode driving signal is input to the first connecting line, the second connecting line connects with the third connecting line, the fourth connecting line connects with the fifth connecting line, an input terminal of the first high voltage signal is connected with a drain electrode of the seventh thin film transistor, a drain electrode of the ninth thin film transistor, and a source electrode of the fourth thin film transistor, an input terminal of the first low voltage signal connects with a source electrode of the sixth thin film transistor, a source electrode of the eighth thin film transistor, and a source electrode of the first thin film transistor, an input terminal of the third clock signal connects with the ninth connecting line, an output terminal of the scan-line driving signal is the drain electrode of the first thin film transistor, a source electrode of the second thin film transistor, and the source electrode of the third thin film transistor.

Preferably, the forward-rearward control module comprises:

A tenth thin film transistor, a gate electrode of the tenth thin film transistor is an input terminal of the first scan-control signal, a drain electrode and a gate electrode of the tenth thin film transistor are respectively an input terminal and an output terminal of the first level-transfer signal. The tenth thin film transistor is used to control an output of the first level-transfer signal according to the first scan-control signal.

An eleventh thin film transistor, a gate electrode of the eleventh thin film transistor is an input terminal of the second scan-control signal, a drain electrode and a gate electrode of the eleventh thin film transistor are respectively an input terminal and an output terminal of the first level-transfer signal. The eleventh thin film transistor is used to control an output of the first level-transfer signal according to the second scan-control signal.

A twelfth thin film transistor, a gate electrode of the twelfth thin film transistor is an input terminal of the first scan-control signal, a drain electrode and a gate electrode of the twelfth thin film transistor are respectively an input terminal and an output terminal of the second level-transfer signal. The twelfth thin film transistor is used to control an output of the second level-transfer signal according to the first scan-control signal.

A thirteenth thin film transistor, a gate electrode of the thirteenth thin film transistor is an input terminal of the second scan-control signal, a drain electrode and a gate electrode of the thirteenth thin film transistor are respectively an input terminal and an output terminal of the second level-transfer signal. The thirteenth thin film transistor is used to control an output of the second level-transfer signal according to the second scan-control signal.

Preferably, the signal-latch module further comprises a reset switch. The reset switch is a fourteenth thin film transistor, a gate electrode of the fourteenth thin film transistor is input to a reset signal, a source electrode of the fourteenth thin film transistor connects with a high voltage source, a drain electrode of the fourteenth thin film transistor connects with the signal-latch module.

Preferably, while the gate-electrode driving signal inputted to the signal-buffer module is a high voltage signal, the first thin film transistor is on, the second thin film transistor and the third thin film transistor are off, the signal-buffer module outputs the first low voltage signal corresponding the first low electric potential, as the scan-line driving signal.

Preferably, while the gate-electrode driving signal inputted to the signal-buffer module is a low voltage signal, the first thin film transistor is off, the second thin film transistor and the third thin film transistor are on, if the third clock signal inputted is a low voltage signal, the fourth thin film transistor is on, the fifth thin film transistor is off, the signal-buffer module outputs the first high voltage signal corresponding the first high electric potential, as the scan-line driving signal.

Preferably, while the gate-electrode driving signal inputted to the signal-buffer module is a low voltage signal, the first thin film transistor is off, the second thin film transistor and the third thin film transistor are on, if the third clock signal inputted is a high voltage signal, the fourth thin film transistor is off, the fifth thin film transistor is on, the signal-buffer module outputs the second high voltage signal corresponding the second high electric potential, as the scan-line driving signal.

The beneficial effect of the present invention is:

The CMOS GOA circuit and the liquid crystal display panel of the present invention designs a thin film transistor group based on the conventional circuit and is inputted the first high voltage signal, the first low voltage signal, the second high voltage signal, and the third clock signal, to make the waveform of the scan-line driving signal have a first high electric potential corresponding with the first high voltage signal, a second high electric potential corresponding with the second high voltage signal, and a first low electric potential corresponding with the first low voltage signal, the waveform forming by the first high electric potential, the second high electric potential, and the first low electric potential having two falling edges. The present invention prevents a un-uniformity of liquid crystal panel display by decreasing the issue of high-shift voltage value of the pixel electrodes caused by the voltage coupling while charging the pixel electrodes.

DETAILED DESCRIPTION OF THE PREFERRED EMBODIMENTS

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, units with similar structures are marked with the same labels.

Embodiment 1

The voltage generated by voltage coupling is caused by coupling between the source electrode and the drain electrode of the thin film transistor at the moment while turning off the scanning line of the liquid crystal display panel, the voltage coupling has the influence on the voltage of the pixel electrodes is: $\Delta V=(V_{off}-V_{on})*C_{gs}/(C_{gs}+C_{st}+C_{lc})$, the $V_{off}$ and $V_{on}$ are turn-off voltage and turn-on voltage of the scanning lines, the $C_{gs}$ is a parasitic capacitance of the thin film transistor, the $C_{st}$ is a storage capacitance, and the $C_{lc}$ is a liquid crystal capacitance.

Figure 1:
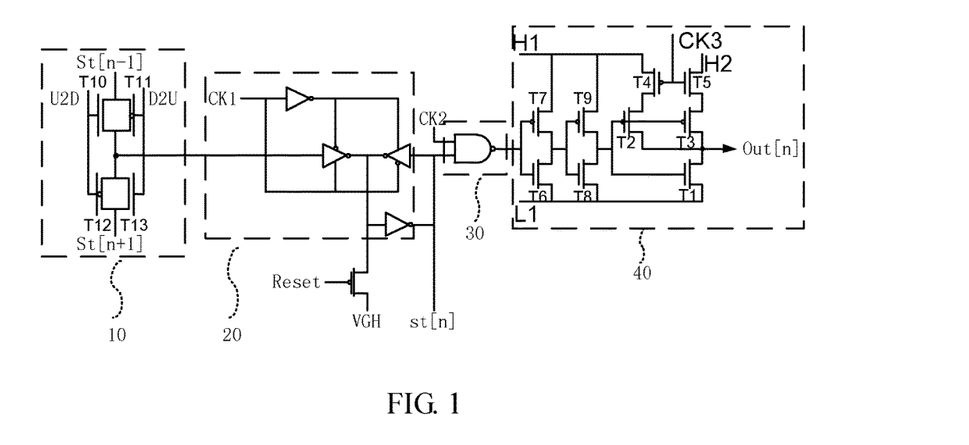
FIG. 1 is a whole structure illustrative diagram of a CMOS GOA circuit according to one embodiment of the present invention.

FIG. 1 is a whole structure illustrative diagram of a Complementary Metal-Oxide-Semiconductor (CMOS) Gate Driver on Array (GOA) circuit according to one embodiment of the present invention. A CMOS GOA circuit of the present invention can be seen in the FIG. 1, which comprises a plurality of cascaded GOA units, each of the GOA units comprises:

A forward-rearward control module 10, signals inputted to an input terminal of the forward-rearward control module 10 comprise a first scan-control signal U2D, a second scan-control signal D2U, a first level-transfer signal St[n−1], and a second level-transfer signal St[n+1]. The forward-rearward control module 10 is used to control an output of the first level-transfer signal St[n−1] and the second level-transfer signal D2U according to the first scan-control signal St[n−1] and the second scan-control signal St[n+1].

A signal-latch module 20, signals inputted to an input terminal of the signal-latch module 20 comprise a first clock signal CK1 and the first level-transfer signal St[n−1] or the second level-transfer signal St[n+1]. The signal-latch module 20 is used to latch the first level-transfer signal St[n−1] or the second level-transfer signal St[n+1] according to the first clock signal CK1, to generate a third level-transfer signal St[n].

A signal-process module 30, signals inputted to an input terminal of the signal-process module 30 comprise a second clock signal CK2 and the third level-transfer signal St[n]. The signal-process module 30 is used to output a current level gate-electrode driving signal according to the second clock signal CK2 and the third level-transfer signal St[n].

A signal-buffer module 40, signals inputted to an input terminal of the signal-buffer module 40 comprise the gate-electrode driving signal, a first high voltage signal H1, a first low voltage signal L1, a second high voltage signal H2, and a third clock signal CK3. Amplitude of the second high voltage signal H2 being less than an amplitude of the first high voltage signal L1. The signal-buffer module 40 is used to output a scan-line driving signal Out[n] according to the first high voltage signal H1, the first low voltage signal L1, the second high voltage signal H2, the third clock signal CK3, and the gate-electrode driving signal. An output waveform of the scan-line driving signal Out[n] has a first high electric potential corresponding with the first high voltage signal H1, a second high electric potential corresponding with the second high voltage signal H2, and a first low electric potential corresponding with the first low voltage signal L1. The waveform is formed by the first high electric potential, the second high electric potential. The first low electric potential has two falling edges.

In the embodiment, the signal-buffer module 40 comprises:

A first inverter, which comprises a sixth NPN-type thin film transistor T6 and a seventh PNP-type thin film transistor T7, the first inverter is used to input the gate-electrode driving signal, the first high voltage signal H1, and the first low voltage signal L1.

A second inverter, which comprises an eighth NPN-type thin film transistor T8 and a ninth PNP-type thin film transistor T9, the second inverter is inputted with the first high voltage signal, and the first low voltage signal.

A thin film transistor group, which comprises a first NPN-type thin film transistor T1, a second PNP-type thin film transistor T2, a third PNP-type thin film transistor T3, a fourth PNP-type thin film transistor T4, and a fifth NPN-type thin film transistor T5. The thin film transistor group is inputted with the first high voltage signal H1, the first low voltage signal L1, the second high voltage signal H2, and the third clock signal CK3. The thin film transistor group is used to output the scan-line driving signal Out[n] to a current-level scanning line.

A gate electrode of the sixth thin film transistor T6 connects with a gate electrode of the seventh thin film transistor T7 to form a first connecting line, a drain electrode of the sixth thin film transistor T6 connects with a source electrode of the seventh thin film transistor T7 to form a second connecting line, a gate electrode of the eighth thin film transistor T8 connects with a gate electrode of the ninth thin film transistor T9 to form a third connecting line, a drain electrode of the eighth thin film transistor T8 connects with a source electrode of the ninth thin film transistor T9 to form a fourth connecting line, a gate electrode of the first thin film transistor T1 connects with a gate electrode of the second thin film transistor T2 to form a fifth connecting line, a drain electrode of the first thin film transistor T1 connects with a source electrode of the third thin film transistor T3 to form a sixth connecting line, a drain electrode of the second thin film transistor T2 connects with a drain electrode of the fourth thin film transistor T4 to form a seventh connecting line, a drain electrode of the third thin film transistor T3 connects with a source electrode of the fifth thin film transistor T5 to form an eighth connecting line, a gate electrode of the fourth thin film transistor T4 connects with a gate electrode of the fifth thin film transistor T5 to form a ninth connecting line, the second thin film transistor T2 and the third thin film transistor T3 connect with each other and have equal voltage.

The gate-electrode driving signal is input to the first connecting line, the second connecting line connects with the third connecting line, the fourth connecting line connects with the fifth connecting line, an input terminal of the first high voltage signal H1 is connected with a drain electrode of the seventh thin film transistor T7, a drain electrode of the ninth thin film transistor T9, and a source electrode of the fourth thin film transistor T4, an input terminal of the first low voltage signal L1 connects with a source electrode of the sixth thin film transistor T6, a source electrode of the eighth thin film transistor T8, and a source electrode of the first thin film transistor T1, an input terminal of the third clock signal CK3 connects with the ninth connecting line, an output terminal of the scan-line driving signal Out[n] is the drain electrode of the first thin film transistor T1, a source electrode of the second thin film transistor T2, and the source electrode of the third thin film transistor T3.

In the embodiment, the forward-rearward control module 10 comprises:

A tenth thin film transistor T10, a gate electrode of the tenth thin film transistor T10 is an input terminal of the first scan-control signal U2D, a drain electrode and a gate electrode of the tenth thin film transistor T10 are respectively an input terminal and an output terminal of the first level-transfer signal St[n−1]. The tenth thin film transistor T10 is used to control an output of the first level-transfer signal St [n−1] according to the first scan-control signal U2D.

An eleventh thin film transistor T11, a gate electrode of the eleventh thin film transistor T11 is an input terminal of the second scan-control signal D2U, a drain electrode and a gate electrode of the eleventh thin film transistor T11 are respectively an input terminal and an output terminal of the first level-transfer signal St[n−1]. The eleventh thin film transistor T11 is used to control an output of the first level-transfer signal St [n−1] according to the second scan-control signal D2U.

A twelfth thin film transistor T12, a gate electrode of the twelfth thin film transistor T12 is an input terminal of the first scan-control signal U2D, a drain electrode and a gate electrode of the twelfth thin film transistor T12 are respectively an input terminal and an output terminal of the second level-transfer signal St[n+1]. The twelfth thin film transistor T12 is used to control an output of the second level-transfer signal St [n+1] according to the first scan-control signal U2D.

A thirteenth thin film transistor T13, a gate electrode of the thirteenth thin film transistor T13 is an input terminal of the second scan-control signal U2D, a drain electrode and a gate electrode of the thirteenth thin film transistor T13 are respectively an input terminal and an output terminal of the second level-transfer signal St[n+1]. The thirteenth thin film transistor T13 is used to control an output of the second level-transfer signal St [n+1] according to the second scan-control signal D2U.

In the embodiment, while performing forward-scanning, the first scan-control signal U2D is a high voltage level signal, the second scan-control signal D2U is a low voltage level signal. While performing rearward-scanning, the first scan-control signal U2D is a low voltage level signal, the second scan-control signal D2U is a high voltage level signal.

In the embodiment, the signal-latch module 20 further comprises a reset switch Reset. The reset switch Reset is a fourteenth thin film transistor, where a gate electrode of the fourteenth thin film transistor is input to a reset signal, a source electrode of the fourteenth thin film transistor connects with a high voltage source VGH, a drain electrode of the fourteenth thin film transistor connects with the signal-latch module 20.

The working principle of the signal-buffer module 40 of the present invention is as below:

In the embodiment, while the gate-electrode driving signal inputted to the signal-buffer module 40 is a high voltage signal, the first thin film transistor T1 is on, the second thin film transistor T2 and the third thin film transistor T3 are off, then, the signal-buffer module 40 outputs the first low voltage signal L1 corresponding the first low electric potential, as the scan-line driving signal Out[n].

In the embodiment, while the gate-electrode driving signal inputted to the signal-buffer module 40 is a low voltage signal, the first thin film transistor T1 is off, the second thin film transistor T2 and the third thin film transistor T3 are on, at this moment, if the third clock signal CK3 inputted is a low voltage signal, the fourth thin film transistor T4 is on, the fifth thin film transistor T5 is off, the signal-buffer module 40 outputs the first high voltage signal H1 corresponding the first high electric potential, as the scan-line driving signal Out[n].

In the embodiment, while the gate-electrode driving signal inputted to the signal-buffer module 40 is a low voltage signal, the first thin film transistor T1 is off, the second thin film transistor T2 and the third thin film transistor T3 are on, at this moment, if the third clock signal CK3 inputted is a high voltage signal, the fourth thin film transistor T4 is off, the fifth thin film transistor T5 is on, the signal-buffer module 40 outputs the second high voltage signal H2 corresponding the second high electric potential, as the scan-line driving signal Out[n].

Figure 2:
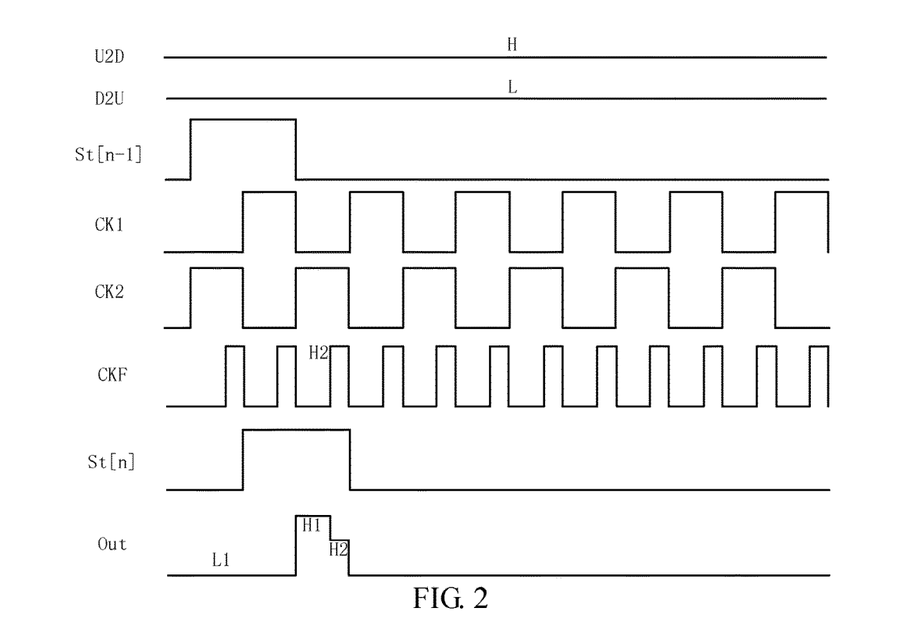
FIG. 2 is a driving sequence diagram of a CMOS GOA circuit according to one embodiment of the present invention.

FIG. 2 is a driving sequence diagram of a CMOS GOA circuit according to one embodiment of the present invention. In the embodiment, it is assumed that a signal outputted from the forward-rearward control module 10 is the first level-transfer signal St [n−1]; the scanning direction is forward-scanning. It can be seen from FIG. 2 that the first scan-control signal U2D and the second scan-control signal D2U are respectively a high voltage signal and a low voltage signal with certain amplitude, hence, we can only adjust the third clock signal CK3 to make the waveform of the scan-line driving signal Out[n] have two falling edges, then the voltage of the scan-line driving signal Out[n] is lowered to a voltage value corresponding to the second high voltage signal H2, to lower the voltage value of the pixel electrodes caused by the voltage coupling.

Figure 3:
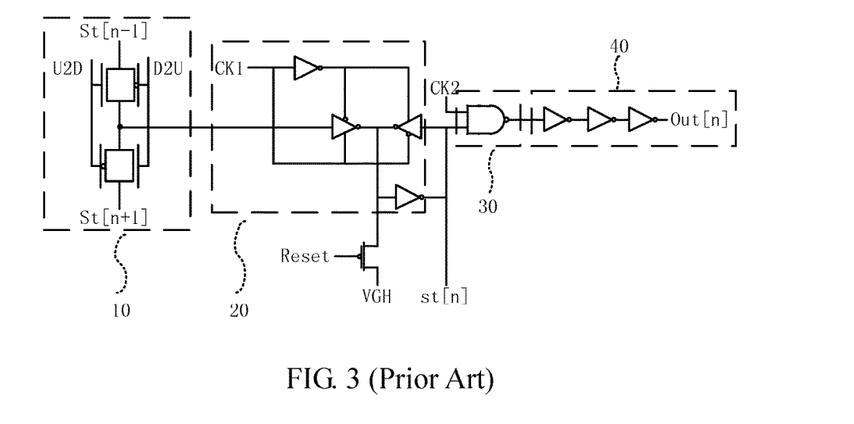
FIG. 3 is a whole structure illustrative diagram of a CMOS GOA circuit according to a conventional art.

FIG. 3 is a whole structure illustrative diagram of a CMOS GOA circuit according to a conventional art. The difference between this COMS GOA circuit and the CMOS GOA circuit of the present invention is that the signal-buffer module 40 is constituted by 3 inverters in series; the third inverter does not change as the thin film group of the present invention. Without the input of the third clock signal CK3, the high-shift voltage value of the pixel electrodes caused by the voltage coupling cannot be lowered.

Figure 4:
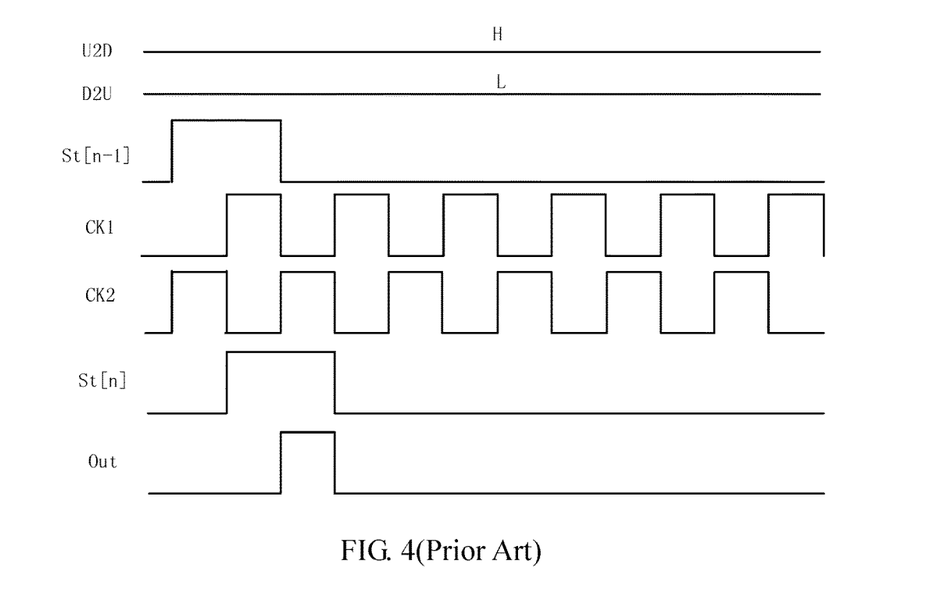
FIG. 4 is a driving sequence diagram of a CMOS GOA circuit according to a conventional art.

FIG. 4 is a driving sequence diagram of a CMOS GOA circuit according to a conventional art. It is assumed that a signal outputted from the forward-rearward control module 10 is the first level-transfer signal St [n−1]; the scanning direction is forward-scanning. It can be seen from FIG. 4 that there is no the third clock signal CK3 of the present invention, the waveform of the scan-line driving signal Out[n] cannot have two falling edges, the high-shift voltage value of the pixel electrodes caused by the voltage coupling couldn't be lowered.

The CMOS GOA circuit of the present invention designs a thin film transistor group based on conventional circuitry and is inputted the first high voltage signal H1, the first low voltage signal L1, the second high voltage signal H2, and the third clock signal CK3, to make the waveform of the scan-line driving signal Out[n] have a first high electric potential corresponding with the first high voltage signal H1, a second high electric potential corresponding with the second high voltage signal H2, and a first low electric potential corresponding with the first low voltage signal L1, the waveform forming by the first high electric potential, the second high electric potential, and the first low electric potential having two falling edges. The present invention prevents a un-uniformity phenomenon of liquid crystal panel display by decreasing the issue of high-shift voltage value of the pixel electrodes caused by the voltage coupling while charging the pixel electrodes.

Embodiment 2

A liquid crystal display panel of the present invention, which comprises a CMOS GOA circuit. FIG. 1 is a whole structure illustrative diagram of a CMOS GOA circuit according to one embodiment of the present invention. A CMOS GOA circuit of the present invention can be seen in the FIG. 1, which comprises a plurality of cascaded GOA units, each of the GOA units comprises:

A forward-rearward control module 10, signals inputted to an input terminal of the forward-rearward control module 10 comprise a first scan-control signal U2D, a second scan-control signal D2U, a first level-transfer signal St[n−1], and a second level-transfer signal St[n+1]. The forward-rearward control module 10 is used to control an output of the first level-transfer signal St[n−1] and the second level-transfer signal D2U according to the first scan-control signal St[n−1] and the second scan-control signal St[n+1].

A signal-latch module 20, signals inputted to an input terminal of the signal-latch module 20 comprise a first clock signal CK1 and the first level-transfer signal St[n−1] or the second level-transfer signal St[n+1]. The signal-latch module 20 is used to latch the first level-transfer signal St[n−1] or the second level-transfer signal St[n+1] according to the first clock signal CK1, to generate a third level-transfer signal St[n].

A signal-process module 30, signals inputted to an input terminal of the signal-process module 30 comprise a second clock signal CK2 and the third level-transfer signal St[n]. The signal-process module 30 is used to output a current level gate-electrode driving signal according to the second clock signal CK2 and the third level-transfer signal St[n].

In the embodiment, the signal-process module 30 is a NAND gate, the second clock signal CK2 and the third level-transfer signal St[n] are inputted into the NAND gate at the same time, to output the current level gate-electrode driving signal according to respective voltage signals.

A signal-buffer module 40, signals inputted to an input terminal of the signal-buffer module 40 comprise the gate-electrode driving signal, a first high voltage signal H1, a first low voltage signal L1, a second high voltage signal H2, and a third clock signal CK3. Amplitude of the second high voltage signal H2 being less than an amplitude of the first high voltage signal L1. The signal-buffer module 40 is used to output a scan-line driving signal Out[n] according to the first high voltage signal H1, the first low voltage signal L1, the second high voltage signal H2, the third clock signal CK3, and the gate-electrode driving signal. An output waveform of the scan-line driving signal Out[n] has a first high electric potential corresponding with the first high voltage signal H1, a second high electric potential corresponding with the second high voltage signal H2, and a first low electric potential corresponding with the first low voltage signal L1. The waveform is formed by the first high electric potential, the second high electric potential. The first low electric potential has two falling edges.

In the embodiment, the signal-buffer module 40 comprises:

A first inverter, which comprises a sixth NPN-type thin film transistor T6 and a seventh PNP-type thin film transistor T7, the first inverter is used to input the gate-electrode driving signal, the first high voltage signal H1, and the first low voltage signal L1.

A second inverter, which comprises an eighth NPN-type thin film transistor T8 and a ninth PNP-type thin film transistor T9, the second inverter is used to be input the first high voltage signal, and the first low voltage signal.

A thin film transistor group, which comprises a first NPN-type thin film transistor T1, a second PNP-type thin film transistor T2, a third PNP-type thin film transistor T3, a fourth PNP-type thin film transistor T4, and a fifth NPN-type thin film transistor T5. The thin film transistor group is inputted with the first high voltage signal H1, the first low voltage signal L1, the second high voltage signal H2, and the third clock signal CK3. The thin film transistor group is used to output the scan-line driving signal Out[n] to a current-level scanning line.

A gate electrode of the sixth thin film transistor T6 connects with a gate electrode of the seventh thin film transistor T7 to form a first connecting line, a drain electrode of the sixth thin film transistor T6 connects with a source electrode of the seventh thin film transistor T7 to form a second connecting line, a gate electrode of the eighth thin film transistor T8 connects with a gate electrode of the ninth thin film transistor T9 to form a third connecting line, a drain electrode of the eighth thin film transistor T8 connects with a source electrode of the ninth thin film transistor T9 to form a fourth connecting line, a gate electrode of the first thin film transistor T1 connects with a gate electrode of the second thin film transistor T2 to form a fifth connecting line, a drain electrode of the first thin film transistor T1 connects with a source electrode of the third thin film transistor T3 to form a sixth connecting line, a drain electrode of the second thin film transistor T2 connects with a drain electrode of the fourth thin film transistor T4 to form a seventh connecting line, a drain electrode of the third thin film transistor T3 connects with a source electrode of the fifth thin film transistor T5 to form an eighth connecting line, a gate electrode of the fourth thin film transistor T4 connects with a gate electrode of the fifth thin film transistor T5 to form a ninth connecting line, the second thin film transistor T2 and the third thin film transistor T3 connect with each other and have equal voltage.

The gate-electrode driving signal is input to the first connecting line, the second connecting line connects with the third connecting line, the fourth connecting line connects with the fifth connecting line, an input terminal of the first high voltage signal H1 is connected with a drain electrode of the seventh thin film transistor T7, a drain electrode of the ninth thin film transistor T9, and a source electrode of the fourth thin film transistor T4, an input terminal of the first low voltage signal L1 connects with a source electrode of the sixth thin film transistor T6, a source electrode of the eighth thin film transistor T8, and a source electrode of the first thin film transistor T1, an input terminal of the third clock signal CK3 connects with the ninth connecting line, an output terminal of the scan-line driving signal Out[n] is the drain electrode of the first thin film transistor T1, a source electrode of the second thin film transistor T2, and the source electrode of the third thin film transistor T3.

In the embodiment, the forward-rearward control module 10 comprises:

A tenth thin film transistor T10, where a gate electrode of the tenth thin film transistor T10 is an input terminal of the first scan-control signal U2D, a drain electrode and a gate electrode of the tenth thin film transistor T10 are respectively an input terminal and an output terminal of the first level-transfer signal St[n−1]. The tenth thin film transistor T10 is used to control an output of the first level-transfer signal St [n−1] according to the first scan-control signal U2D.

An eleventh thin film transistor T11, where a gate electrode of the eleventh thin film transistor T11 is an input terminal of the second scan-control signal D2U, a drain electrode and a gate electrode of the eleventh thin film transistor T11 are respectively an input terminal and an output terminal of the first level-transfer signal St[n−1]. The eleventh thin film transistor T11 is used to control an output of the first level-transfer signal St [n−] according to the second scan-control signal D2U.

A twelfth thin film transistor T12, where a gate electrode of the twelfth thin film transistor T12 is an input terminal of the first scan-control signal U2D, a drain electrode and a gate electrode of the twelfth thin film transistor T12 are respectively an input terminal and an output terminal of the second level-transfer signal St[n+1]. The twelfth thin film transistor T12 is used to control an output of the second level-transfer signal St [n+1] according to the first scan-control signal U2D.

A thirteenth thin film transistor T13, where a gate electrode of the thirteenth thin film transistor T13 is an input terminal of the second scan-control signal U2D, a drain electrode and a gate electrode of the thirteenth thin film transistor T13 are respectively an input terminal and an output terminal of the second level-transfer signal St[n+1]. The thirteenth thin film transistor T13 is used to control an output of the second level-transfer signal St [n+1] according to the second scan-control signal D2U.

The liquid crystal display panel of the present invention employs a thin film transistor group based on conventional circuitry and is inputted with the first high voltage signal H1, the first low voltage signal L1, the second high voltage signal H2, and the third clock signal CK3, to make the waveform of the scan-line driving signal Out[n] have a first high electric potential corresponding with the first high voltage signal H1, a second high electric potential corresponding with the second high voltage signal H2, and a first low electric potential corresponding with the first low voltage signal L1, the waveform forming by the first high electric potential, the second high electric potential, and the first low electric potential having two falling edges. The present invention prevents un-uniformity of liquid crystal panel display by decreasing the issue of high-shift voltage value of the pixel electrodes caused by the voltage coupling while charging the pixel electrodes.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A Complementary Metal-Oxide-Semiconductor (CMOS) Gate Driver on Array (GOA) circuit comprising a plurality of cascaded GOA units, each of the GOA units comprising:
   a forward-rearward control module, wherein signals inputted to an input terminal of the forward-rearward control module comprise a first scan-control signal, a second scan-control signal, a first level-transfer signal, and a second level-transfer signal, the forward-rearward control module used to control an output of the first level-transfer signal and the second level-transfer signal according to the first scan-control signal and the second scan-control signal;
   a signal-latch module, wherein signals inputted to an input terminal of the signal-latch module comprise a first clock signal and the first level-transfer signal or the second level-transfer signal, the signal-latch module used to latch the first level-transfer signal or the second level-transfer signal according to the first clock signal, to generate a third level-transfer signal;
   a signal-process module, wherein signals inputted to an input terminal of the signal-process module comprise a second clock signal and the third level-transfer signal, the signal-process module used to output a current level gate-electrode driving signal according to the second clock signal and the third level-transfer signal; and
   a signal-buffer module, wherein signals inputted to an input terminal of the signal-buffer module comprise the gate-electrode driving signal, a first high voltage signal, a first low voltage signal, a second high voltage signal, and a third clock signal, an amplitude of the second high voltage signal being less than an amplitude of the first high voltage signal, the signal-buffer module being used to output a scan-line driving signal according to the first high voltage signal, the first low voltage signal, the second high voltage signal, the third clock signal, and the gate-electrode driving signal, an output waveform of the scan-line driving signal has a first high electric potential corresponding with the first high voltage signal, a second high electric potential corresponding with the second high voltage signal, and a first low electric potential corresponding with the first low voltage signal, the waveform forming by the first high electric potential, the second high electric potential, and the first low electric potential having two falling edges;
   wherein the signal-buffer module comprises:
   a first inverter, which comprises a sixth NPN-type thin film transistor and a seventh PNP-type thin film transistor, the first inverter is used to input the gate-electrode driving signal, the first high voltage signal, and the first low voltage signal;
   a second inverter, which comprises a eighth NPN-type thin film transistor and a ninth PNP-type thin film transistor, the second inverter is used to be inputted the first high voltage signal, and the first low voltage signal; and
   a thin film transistor group, which comprises a first NPN-type thin film transistor, a second PNP-type thin film transistor, a third PNP-type thin film transistor, a fourth PNP-type thin film transistor, and a fifth NPN-type thin film transistor, the thin film transistor group is used to be inputted the first high voltage signal, the first low voltage signal, the second high voltage signal, and the third clock signal, the thin film transistor group is used to output the scan-line driving signal to a current-level scanning line;
   wherein a gate electrode of the sixth thin film transistor connects with a gate electrode of the seventh thin film transistor to form a first connecting line, a drain electrode of the sixth thin film transistor connects with a source electrode of the seventh thin film transistor to form a second connecting line, a gate electrode of the eighth thin film transistor connects with a gate electrode of the ninth thin film transistor to form a third connecting line, a drain electrode of the eighth thin film transistor connects with a source electrode of the ninth thin film transistor to form a fourth connecting line, a gate electrode of the first thin film transistor connects with a gate electrode of the second thin film transistor to form a fifth connecting line, a drain electrode of the first thin film transistor connects with a source electrode of the third thin film transistor to form a sixth connecting line, a drain electrode of the second thin film transistor connects with a drain electrode of the fourth thin film transistor to form a seventh connecting line, a drain electrode of the third thin film transistor connects with a source electrode of the fifth thin film transistor to form an eighth connecting line, a gate electrode of the fourth thin film transistor connects with a gate electrode of the fifth thin film transistor to form a ninth connecting line, the second thin film transistor and the third thin film transistor connect with each other and have equal voltage;
   wherein the gate-electrode driving signal is input to the first connecting line, the second connecting line connects with the third connecting line, the fourth connecting line connects with the fifth connecting line, an input terminal of the first high voltage signal is connected with a drain electrode of the seventh thin film transistor, a drain electrode of the ninth thin film transistor, and a source electrode of the fourth thin film transistor, an input terminal of the first low voltage signal connects with a source electrode of the sixth thin film transistor, a source electrode of the eighth thin film transistor, and a source electrode of the first thin film transistor, an input terminal of the third clock signal connects with the ninth connecting line, an output terminal of the scan-line driving signal is the drain electrode of the first thin film transistor, a source electrode of the second thin film transistor, and the source electrode of the third thin film transistor;
   wherein the forward-rearward control module comprises:
   a tenth thin film transistor, a gate electrode of the tenth thin film transistor is an input terminal of the first scan-control signal, a drain electrode and a gate electrode of the tenth thin film transistor are respectively an input terminal and an output terminal of the first level-transfer signal, the tenth thin film transistor is used to control an output of the first level-transfer signal according to the first scan-control signal;
   an eleventh thin film transistor, a gate electrode of the eleventh thin film transistor is an input terminal of the second scan-control signal, a drain electrode and a gate electrode of the eleventh thin film transistor are respectively an input terminal and an output terminal of the first level-transfer signal, the eleventh thin film transistor is used to control an output of the first level-transfer signal according to the second scan-control signal;

a twelfth thin film transistor, a gate electrode of the twelfth thin film transistor is an input terminal of the first scan-control signal, a drain electrode and a gate electrode of the twelfth thin film transistor are respectively an input terminal and an output terminal of the second level-transfer signal, the twelfth thin film transistor is used to control an output of the second level-transfer signal according to the first scan-control signal; and a thirteenth thin film transistor, a gate electrode of the thirteenth thin film transistor is an input terminal of the second scan-control signal, a drain electrode and a gate electrode of the thirteenth thin film transistor are respectively an input terminal and an output terminal of the second level-transfer signal, the thirteenth thin film transistor is used to control an output of the second level-transfer signal according to the second scan-control signal.

2. The CMOS GOA circuit according to claim 1, wherein the signal-latch module further comprises a reset switch, the reset switch is a fourteenth thin film transistor, a gate electrode of the fourteenth thin film transistor is input to a reset signal, a source electrode of the fourteenth thin film transistor connects with a high voltage source, a drain electrode of the fourteenth thin film transistor connects with the signal-latch module.

3. The CMOS GOA circuit according to claim 1, while the gate-electrode driving signal inputted to the signal-buffer module is a high voltage signal, the first thin film transistor is on, the second thin film transistor and the third thin film transistor are off, the signal-buffer module outputs the first low voltage signal corresponding the first low electric potential, as the scan-line driving signal.

4. The CMOS GOA circuit according to claim 1, while the gate-electrode driving signal inputted to the signal-buffer module is a low voltage signal, the first thin film transistor is off, the second thin film transistor and the third thin film transistor are on, if the third clock signal inputted is a low voltage signal, the fourth thin film transistor is on, the fifth thin film transistor is off, the signal-buffer module outputs the first high voltage signal corresponding the first high electric potential, as the scan-line driving signal.

5. The CMOS GOA circuit according to claim 1, while the gate-electrode driving signal inputted to the signal-buffer module is a low voltage signal, the first thin film transistor is off, the second thin film transistor and the third thin film transistor are on, if the third clock signal inputted is a high voltage signal, the fourth thin film transistor is off, the fifth thin film transistor is on, the signal-buffer module outputs the second high voltage signal corresponding the second high electric potential, as the scan-line driving signal.

6. A Complementary Metal-Oxide-Semiconductor (CMOS) Gate Driver on Array (GOA) circuit, wherein the CMOS GOA circuit comprises a plurality of cascaded GOA units, each of the GOA units comprising:

a forward-rearward control module, wherein signals inputted to an input terminal of the forward-rearward control module comprise a first scan-control signal, a second scan-control signal, a first level-transfer signal, and a second level-transfer signal, the forward-rearward control module controlling an output of the first level-transfer signal and the second level-transfer signal according to the first scan-control signal and the second scan-control signal;

a signal-latch module, wherein signals inputted to an input terminal of the signal-latch module comprise a first clock signal and the first level-transfer signal or the second level-transfer signal, the signal-latch module latching the first level-transfer signal or the second level-transfer signal according to the first clock signal, to generate a third level-transfer signal;

a signal-process module, wherein signals inputted to an input terminal of the signal-process module comprise a second clock signal and the third level-transfer signal, the signal-process module outputting a current level gate-electrode driving signal according to the second clock signal and the third level-transfer signal; and a signal-buffer module, wherein signals inputted to an input terminal of the signal-buffer module comprise the gate-electrode driving signal, a first high voltage signal, a first low voltage signal, a second high voltage signal, and a third clock signal, an amplitude of the second high voltage signal being less than an amplitude of the first high voltage signal, the signal-buffer module being used to output a scan-line driving signal according to the first high voltage signal, the first low voltage signal, the second high voltage signal, the third clock signal, and the gate-electrode driving signal, an output waveform of the scan-line driving signal has a first high electric potential corresponding with the first high voltage signal, a second high electric potential corresponding with the second high voltage signal, and a first low electric potential corresponding with the first low voltage signal, the waveform forming by the first high electric potential, the second high electric potential, and the first low electric potential having two falling edges.

7. The CMOS GOA circuit according to claim 6, wherein the signal-buffer module comprises:

a first inverter, which comprises a sixth NPN-type thin film transistor and a seventh PNP-type thin film transistor, the first inverter is used to input the gate-electrode driving signal, the first high voltage signal, and the first low voltage signal;

a second inverter, which comprises a eighth NPN-type thin film transistor and a ninth PNP-type thin film transistor, the second inverter inputting the first high voltage signal, and the first low voltage signal; and a thin film transistor group, which comprises a first NPN-type thin film transistor, a second PNP-type thin film transistor, a third PNP-type thin film transistor, a fourth PNP-type thin film transistor, and a fifth NPN-type thin film transistor, the thin film transistor group inputting the first high voltage signal, the first low voltage signal, the second high voltage signal, and the third clock signal, the thin film transistor group outputting the scan-line driving signal to a current-level scanning line;

wherein a gate electrode of the sixth thin film transistor connects with a gate electrode of the seventh thin film transistor to form a first connecting line, a drain electrode of the sixth thin film transistor connects with a source electrode of the seventh thin film transistor to form a second connecting line, a gate electrode of the eighth thin film transistor connects with a gate electrode of the ninth thin film transistor to form a third connecting line, a drain electrode of the eighth thin film transistor connects with a source electrode of the ninth thin film transistor to form a fourth connecting line, a gate electrode of the first thin film transistor connects with a gate electrode of the second thin film transistor to form a fifth connecting line, a drain electrode of the first thin film transistor connects with a source electrode of the third thin film transistor to form a sixth connecting line, a drain electrode of the second thin film transistor connects with a drain electrode of the fourth thin film transistor to form a seventh connecting line, a drain electrode of the third thin film transistor connects with a source electrode of the fifth thin film transistor to form an eighth connecting line, a gate electrode of the fourth thin film transistor connects with a gate electrode of the fifth thin film transistor to form a ninth connecting line, the second thin film transistor and the third thin film transistor connect with each other and have equal voltage;

wherein the gate-electrode driving signal is input to the first connecting line, the second connecting line connects with the third connecting line, the fourth connecting line connects with the fifth connecting line, an input terminal of the first high voltage signal is connected with a drain electrode of the seventh thin film transistor, a drain electrode of the ninth thin film transistor, and a source electrode of the fourth thin film transistor, an input terminal of the first low voltage signal connects with a source electrode of the sixth thin film transistor, a source electrode of the eighth thin film transistor, and a source electrode of the first thin film transistor, an input terminal of the third clock signal connects with the ninth connecting line, an output terminal of the scan-line driving signal is the drain electrode of the first thin film transistor, a source electrode of the second thin film transistor, and the source electrode of the third thin film transistor.

8. The CMOS GOA circuit according to claim 6, wherein the forward-rearward control module comprises:

a tenth thin film transistor, a gate electrode of the tenth thin film transistor is an input terminal of the first scan-control signal, a drain electrode and a gate electrode of the tenth thin film transistor are respectively an input terminal and an output terminal of the first level-transfer signal, the tenth thin film transistor controlling an output of the first level-transfer signal according to the first scan-control signal;

an eleventh thin film transistor, a gate electrode of the eleventh thin film transistor is an input terminal of the second scan-control signal, a drain electrode and a gate electrode of the eleventh thin film transistor are respectively an input terminal and an output terminal of the first level-transfer signal, the eleventh thin film transistor is used to control an output of the first level-transfer signal according to the second scan-control signal;

a twelfth thin film transistor, a gate electrode of the twelfth thin film transistor is an input terminal of the first scan-control signal, a drain electrode and a gate electrode of the twelfth thin film transistor are respectively an input terminal and an output terminal of the second level-transfer signal, the twelfth thin film transistor controlling an output of the second level-transfer signal according to the first scan-control signal; and a thirteenth thin film transistor, a gate electrode of the thirteenth thin film transistor is an input terminal of the second scan-control signal, a drain electrode and a gate electrode of the thirteenth thin film transistor are respectively an input terminal and an output terminal of the second level-transfer signal, the thirteenth thin film transistor controlling an output of the second level-transfer signal according to the second scan-control signal.

9. The CMOS GOA circuit according to claim 6, wherein the signal-latch module further comprises a reset switch, the reset switch is a fourteenth thin film transistor, a gate electrode of the fourteenth thin film transistor is input to a reset signal, a source electrode of the fourteenth thin film transistor connects with a high voltage source, a drain electrode of the fourteenth thin film transistor connects with the signal-latch module.

10. The CMOS GOA circuit according to claim 7, while the gate-electrode driving signal inputted to the signal-buffer module is a high voltage signal, the first thin film transistor is on, the second thin film transistor and the third thin film transistor are off, the signal-buffer module outputs the first low voltage signal corresponding the first low electric potential, as the scan-line driving signal.

11. The CMOS GOA circuit according to claim 7, while the gate-electrode driving signal inputted to the signal-buffer module is a low voltage signal, the first thin film transistor is off, the second thin film transistor and the third thin film transistor are on, if the third clock signal inputted is a low voltage signal, the fourth thin film transistor is on, the fifth thin film transistor is off, the signal-buffer module outputs the first high voltage signal corresponding the first high electric potential, as the scan-line driving signal.

12. The CMOS GOA circuit according to claim 7, while the gate-electrode driving signal inputted to the signal-buffer module is a low voltage signal, the first thin film transistor is off, the second thin film transistor and the third thin film transistor are on, if the third clock signal inputted is a high voltage signal, the fourth thin film transistor is off, the fifth thin film transistor is on, the signal-buffer module outputs the second high voltage signal corresponding the second high electric potential, as the scan-line driving signal.

13. A liquid crystal display panel comprising a Complementary Metal-Oxide-Semiconductor (CMOS) Gate Driver on Array (GOA) circuit circuit, the CMOS GOA circuit comprising a plurality of cascaded GOA units, each of the GOA units comprising:

a forward-rearward control module, wherein signals inputted to an input terminal of the forward-rearward control module comprise a first scan-control signal, a second scan-control signal, a first level-transfer signal, and a second level-transfer signal, the forward-rearward control module being used to control an output of the first level-transfer signal and the second level-transfer signal according to the first scan-control signal and the second scan-control signal;

a signal-latch module, wherein signals inputted to an input terminal of the signal-latch module comprise a first clock signal and the first level-transfer signal or the second level-transfer signal, the signal-latch module being used to latch the first level-transfer signal or the second level-transfer signal according to the first clock signal, to generate a third level-transfer signal;

a signal-process module, wherein signals inputted to an input terminal of the signal-process module comprise a second clock signal and the third level-transfer signal, the signal-process module outputting a current level gate-electrode driving signal according to the second clock signal and the third level-transfer signal; and a signal-buffer module, wherein signals inputted to an input terminal of the signal-buffer module comprise the gate-electrode driving signal, a first high voltage signal, a first low voltage signal, a second high voltage signal, and a third clock signal, an amplitude of the second high voltage signal being less than an amplitude of the first high voltage signal, the signal-buffer module outputting a scan-line driving signal according to the first high voltage signal, the first low voltage signal, the second high voltage signal, the third clock signal, and the gate-electrode driving signal, an output waveform of the scan-line driving signal has a first high electric potential corresponding with the first high voltage signal, a second high electric potential corresponding with the second high voltage signal, and a first low electric potential corresponding with the first low voltage signal, the waveform forming by the first high electric potential, the second high electric potential, and the first low electric potential having two falling edges.

14. The liquid crystal display panel according to claim 13, wherein the signal-buffer module comprises:
   a first inverter, which comprises a sixth NPN-type thin film transistor and a seventh PNP-type thin film transistor, the first inverter inputting the gate-electrode driving signal, the first high voltage signal, and the first low voltage signal;
   a second inverter, which comprises a eighth NPN-type thin film transistor and a ninth PNP-type thin film transistor, the second inverter inputting the first high voltage signal, and the first low voltage signal; and
   a thin film transistor group, which comprises a first NPN-type thin film transistor, a second PNP-type thin film transistor, a third PNP-type thin film transistor, a fourth PNP-type thin film transistor, and a fifth NPN-type thin film transistor, the thin film transistor group inputting the first high voltage signal, the first low voltage signal, the second high voltage signal, and the third clock signal, the thin film transistor group is used to output the scan-line driving signal to a current-level scanning line;
   wherein a gate electrode of the sixth thin film transistor connects with a gate electrode of the seventh thin film transistor to form a first connecting line, a drain electrode of the sixth thin film transistor connects with a source electrode of the seventh thin film transistor to form a second connecting line, a gate electrode of the eighth thin film transistor connects with a gate electrode of the ninth thin film transistor to form a third connecting line, a drain electrode of the eighth thin film transistor connects with a source electrode of the ninth thin film transistor to form a fourth connecting line, a gate electrode of the first thin film transistor connects with a gate electrode of the second thin film transistor to form a fifth connecting line, a drain electrode of the first thin film transistor connects with a source electrode of the third thin film transistor to form a sixth connecting line, a drain electrode of the second thin film transistor connects with a drain electrode of the fourth thin film transistor to form a seventh connecting line, a drain electrode of the third thin film transistor connects with a source electrode of the fifth thin film transistor to form an eighth connecting line, a gate electrode of the fourth thin film transistor connects with a gate electrode of the fifth thin film transistor to form a ninth connecting line, the second thin film transistor and the third thin film transistor connect with each other and have equal voltage;
   wherein the gate-electrode driving signal is input to the first connecting line, the second connecting line connects with the third connecting line, the fourth connecting line connects with the fifth connecting line, an input terminal of the first high voltage signal is connected with a drain electrode of the seventh thin film transistor, a drain electrode of the ninth thin film transistor, and a source electrode of the fourth thin film transistor, an input terminal of the first low voltage signal connects with a source electrode of the sixth thin film transistor, a source electrode of the eighth thin film transistor, and a source electrode of the first thin film transistor, an input terminal of the third clock signal connects with the ninth connecting line, an output terminal of the scan-line driving signal is the drain electrode of the first thin film transistor, a source electrode of the second thin film transistor, and the source electrode of the third thin film transistor.

15. The liquid crystal display panel according to claim 13, wherein the forward-rearward control module comprises:
   a tenth thin film transistor, a gate electrode of the tenth thin film transistor is an input terminal of the first scan-control signal, a drain electrode and a gate electrode of the tenth thin film transistor are respectively an input terminal and an output terminal of the first level-transfer signal, the tenth thin film transistor controlling an output of the first level-transfer signal according to the first scan-control signal;
   an eleventh thin film transistor, a gate electrode of the eleventh thin film transistor is an input terminal of the second scan-control signal, a drain electrode and a gate electrode of the eleventh thin film transistor are respectively an input terminal and an output terminal of the first level-transfer signal, the eleventh thin film transistor controlling an output of the first level-transfer signal according to the second scan-control signal;
   a twelfth thin film transistor, a gate electrode of the twelfth thin film transistor is an input terminal of the first scan-control signal, a drain electrode and a gate electrode of the twelfth thin film transistor are respectively an input terminal and an output terminal of the second level-transfer signal, the twelfth thin film transistor controlling an output of the second level-transfer signal according to the first scan-control signal; and
   a thirteenth thin film transistor, a gate electrode of the thirteenth thin film transistor is an input terminal of the second scan-control signal, a drain electrode and a gate electrode of the thirteenth thin film transistor are respectively an input terminal and an output terminal of the second level-transfer signal, the thirteenth thin film transistor controlling an output of the second level-transfer signal according to the second scan-control signal.

16. The liquid crystal display panel according to claim 13, wherein the signal-latch module further comprises a reset switch, the reset switch is a fourteenth thin film transistor, a gate electrode of the fourteenth thin film transistor is input with a reset signal, a source electrode of the fourteenth thin film transistor connects with a high voltage source, a drain electrode of the fourteenth thin film transistor connects with the signal-latch module.

17. The liquid crystal display panel according to claim 14, while the gate-electrode driving signal inputted to the signal-buffer module is a high voltage signal, the first thin film transistor is on, the second thin film transistor and the third thin film transistor are off, the signal-buffer module outputs the first low voltage signal corresponding the first low electric potential, as the scan-line driving signal.

18. The liquid crystal display panel according to claim 14, while the gate-electrode driving signal inputted to the signal-buffer module is a low voltage signal, the first thin film transistor is off, the second thin film transistor and the third thin film transistor are on, if the third clock signal inputted is a low voltage signal, the fourth thin film transistor is on, the fifth thin film transistor is off, the signal-buffer module outputs the first high voltage signal corresponding the first high electric potential, as the scan-line driving signal.

19. The liquid crystal display panel according to claim 14, while the gate-electrode driving signal inputted to the signal-buffer module is a low voltage signal, the first thin film transistor is off, the second thin film transistor and the third thin film transistor are on, if the third clock signal inputted is a high voltage signal, the fourth thin film transistor is off, the fifth thin film transistor is on, the signal-buffer module outputs the second high voltage signal corresponding the second high electric potential, as the scan-line driving signal.

* * * * *